(12) United States Patent
Hanley et al.

(10) Patent No.: US 7,288,161 B2
(45) Date of Patent: Oct. 30, 2007

(54) REWORKABLE ADHESIVES CONTAINING THERMALLY LABILE GROUPS

(75) Inventors: Matthew M. Hanley, Rochester, MN (US); Joseph Kuczynski, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 484 days.

(21) Appl. No.: 10/892,462

(22) Filed: Jul. 15, 2004

(65) Prior Publication Data

US 2006/0014924 A1    Jan. 19, 2006

(51) Int. Cl.
*B32B 37/12* (2006.01)
*B32B 37/14* (2006.01)
*B29B 17/04* (2006.01)
*C09J 163/00* (2006.01)
*C08L 63/00* (2006.01)

(52) U.S. Cl. .................. 156/152; 156/94; 156/330; 523/400; 525/523

(58) Field of Classification Search .................. None
See application file for complete search history.

(56) References Cited

U.S. PATENT DOCUMENTS

| | | | | |
|---|---|---|---|---|
| 3,496,119 A * | 2/1970 | Fitzgerald et al. | .......... | 427/386 |
| 4,208,311 A * | 6/1980 | Kinoshita et al. | ........... | 524/369 |
| 4,257,699 A * | 3/1981 | Lentz | .................... | 430/124.33 |
| 4,264,181 A * | 4/1981 | Lentz et al. | ........... | 430/124.33 |
| 4,882,399 A * | 11/1989 | Tesoro et al. | ................ | 525/523 |
| 5,164,442 A * | 11/1992 | Itoh et al. | .................... | 524/492 |
| 6,172,141 B1 | 1/2001 | Wong et al. | | |
| 6,380,322 B1 | 4/2002 | Wong et al. | | |
| 6,570,029 B2 | 5/2003 | Wang et al. | | |
| 2002/0013420 A1* | 1/2002 | Wang et al. | ................. | 525/406 |
| 2003/0116347 A1* | 6/2003 | Kubo et al. | .................. | 174/260 |
| 2004/0249037 A1* | 12/2004 | Kolbe et al. | ................. | 524/401 |

FOREIGN PATENT DOCUMENTS

WO    WO 03/031492 A1    4/2003

OTHER PUBLICATIONS

Wang, L.J. et al; "Novel Thermally Reworkable Underfill Encapsulants for Flip-Chip Applications", IEEE Transactions on Advanced Packaging, 1999.*
Wang, L.J. et al; "Synthesis and Characterizations of Thermally Reworkable Epoxy Resins, Part I", Journal of Polymer Science Part A-Polymer Chemistry, 1999.*
Wang, L.J. et al; "Novel Thermally Reworkable Underfill Encapsulants for Flip-Chip Applications", IEEE Transactions on Advanced Packaging, Abstract, 1999.
Wang, L.J. et al; "Syntheses and Characterizations of Thermally Reworkable Epoxy Resins, Part I", Journal of Polymer Science Part A-Polymer Chemistry, Abstract, 1999.

* cited by examiner

*Primary Examiner*—Michael J. Feely
(74) *Attorney, Agent, or Firm*—Patterson & Sheridan

(57) ABSTRACT

Embodiments of the present invention relate to adhesive compositions containing thermally-labile groups for decreasing the degradation temperature of the adhesive for reworkability of electronic components in surface mounting applications. In one embodiment, the thermally reworkable epoxy-based composition is a cured product of a multifunctional epoxide and a curing agent, the curing agent having at least one thermally-labile group. Upon heating the thermally reworkable epoxy-based composition above a desired trigger temperature, the thermally-labile group decomposes thereby effecting depolymerization in the network. Consequently, the physical properties (e.g., shear strength) of the adhesive network are severely degraded thereby enabling easy removal of the device. In another embodiment, a thermally reworkable epoxy-based composition is a cured product of an epoxide having at least one thermally-labile group and a curing agent having at least one thermally-labile group.

13 Claims, 2 Drawing Sheets

HEAT ( T > TRIGGER T )

■—■ = MULTIFUNCTIONAL EPOXY   \ = EPOXY - AMINE CROSSLINK

●—● = AZODICARBONAMIDE

⸰⸺ = BROKEN BOND

HEAT ( T > TRIGGER T )

■—■ = MULTIFUNCTIONAL EPOXY   \ = EPOXY - AMINE CROSSLINK

●—● = AZODICARBONAMIDE

⸽ = BROKEN BOND

REWORKABLE ADHESIVES CONTAINING THERMALLY LABILE GROUPS

BACKGROUND OF THE INVENTION

1. Field of the Invention

Embodiments of the present invention relate to adhesive compositions containing thermally-labile groups. In particular, thermally degradable, epoxy-based adhesive compositions suitable for rework use in electronic component surface mounting applications are provided.

2. Description of the Related Art

Epoxy-based adhesives are thermosetting materials routinely employed in the electronics industry as encapsulants or underfill for electronic components, e.g., integrated circuit (IC) devices, surface mounted onto printed circuit (PC) boards. Epoxy-based adhesives may be used as an encapsulant to provide a rigid, hermetic seal for electronic components to protect the input/output metallic leads of the device from corrosion or other environmental conditions. Epoxy-based adhesives are also used as an underfill to maintain the mechanical integrity of the solder joints attaching the leads of the device to the bond pads of the PC board. Due to the difference in the coefficients of thermal expansion of the materials used in fabricating the device (e.g., ceramic IC packaging with metallic leads) and the PC board (e.g., polymeric), the soldered leads experience mechanical stress as a result of temperature changes or thermal cycling over the life of the device. Over time, these mechanical stresses may lead to device failure as a result of breakage of one or more soldered leads. To prevent a shortened fatigue life of a surface-mounted device, an underfill is applied to reinforce the soldered joints between the device and the PC board. The composition of the epoxy-based adhesive underfill can be tailored such that its thermal coefficient of expansion matches that of the solder so as to reduce relative movement and fatigue induced mechanical failure.

However, during curing, epoxies crosslink to form intractable networks that are difficult and impractical to rework when a faulty surface-mounted component is discovered. Epoxy-based adhesives are typically polymerized with various reactive agents such as anhydrides, aliphatic amines, aromatic amines, and mercaptans. The resulting polymers are tightly crosslinked networks that are solvent resistant and thermally stable. Consequently, the board to which the epoxy is applied is often discarded when a faulty surface-mounted device is discovered during burn-in or some other downstream process.

To make the adhesive reworkable, one method has been to develop a thermally degradable epoxy-based adhesive formulated by crosslinking an epoxide having a thermally-labile group within its structure with a curing agent. If rework is necessary, the cured adhesive is heated above a certain temperature such that the thermally-labile group integral to the epoxide cleaves thereby decomposing the adhesive network to facilitate removal of the defective component. Examples of thermally-labile groups introduced into the cured adhesive by the epoxide include alpha-alkoxy ester, oxycarbonyl, carbonate, and carbamate linkages.

Notwithstanding the state of the art, there is a need for epoxy-based adhesive compositions which provide the requisite physical properties when cured and at the same time are reworkable at a desired trigger temperature so as to allow for replacement of a device.

SUMMARY OF THE INVENTION

The present invention generally provides a thermally reworkable epoxy-based adhesive composition having a thermally-labile group introduced in a curing agent. In one embodiment, a thermally reworkable epoxy-based adhesive composition is formulated using a curing agent composition having a thermally-labile group which imparts thermal reworkability to the adhesive at a desired trigger temperature. In another embodiment, a thermally reworkable epoxy-based adhesive composition is formulated using both a curing agent composition having a thermally-labile group and an epoxide composition having a thermally-labile group.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Figure 1A:
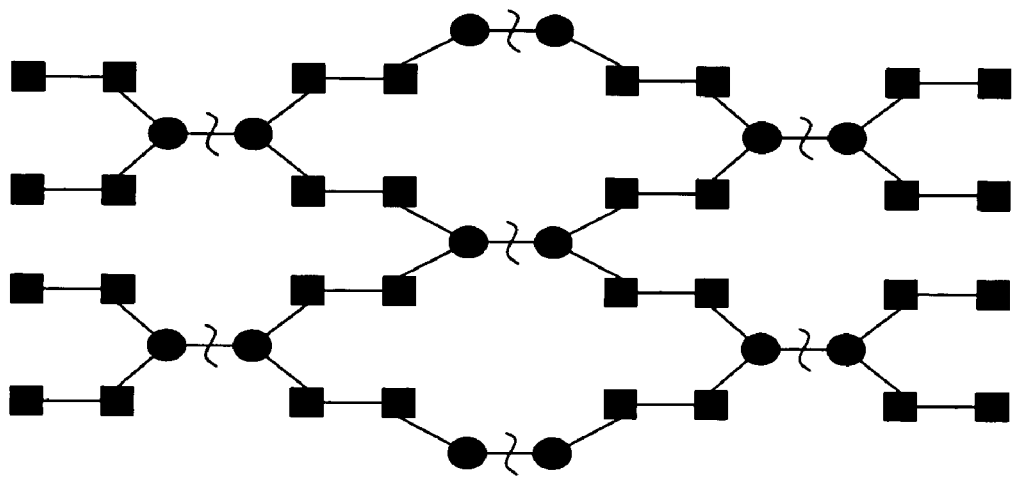
FIGS. 1a and 1b depict thermal decomposition of an exemplary thermally reworkable epoxy-based polymer formulated using a curing agent composition having a thermally-labile group.

The present invention generally provides a thermally reworkable epoxy-based composition formulated using a curing agent composition having a thermally-labile group which decomposes at a desired trigger temperature. By appropriate selection of the curing agent, the trigger temperature can be varied to suit the intended application or desired rework temperature range. Preferably, for electronic component surface mounting applications, the thermally reworkable adhesive is cured at typical process temperatures less than about 150° C., yet can be depolymerized at a prescribed trigger temperature having a value higher than the curing temperature and less than about 250° C. to avoid unacceptable thermal damage to the PC board or surrounding components. At rework temperatures (i.e., temperatures greater than or equal to the trigger temperature), the thermally-labile groups decompose such that the crosslinking of the epoxy-based polymer degrades (depolymerizes) and the physical properties such as shear strength decrease to facilitate localized removal of an electronic component (e.g., defective IC chip).

In one embodiment, a thermally reworkable epoxy-based adhesive composition of the present invention is formulated by combining a multifunctional epoxy with a multifunctional amine curing agent comprising a thermally-labile (i.e., thermally cleavable) group. Upon curing, the epoxy polymerizes forming a crosslinked network exhibiting high shear strength. Crosslinking primarily occurs between the nitrogen N of an amine group of the curing agent and the α-C of an epoxide ring of the multifunctional epoxy. At rework temperatures generally in a range of about 130° C. to about 250° C., the thermally-labile groups decompose such that the crosslinking of the polymer degrades (depolymerizes) and the physical properties such as shear strength decrease to facilitate removal of the electronic component. Preferably, rework temperatures are in a range of about 200° C. to about 250° C.

The epoxy generally includes any multifunctional aliphatic or cycloaliphatic epoxy. Suitable epoxies include diepoxides, triepoxides, tetraepoxides, or a combination mixture thereof depending upon the desired degree of crosslinking (i.e., a higher functionality provides a higher degree of crosslinking). Optionally, monofunctional epoxy may be added to the multifunctional epoxy, such that the uncured epoxy contains a mixture of multifunctional and monofunctional epoxides. Preferred epoxies include epoxidized novolak polymers, polyepoxides such as epichlorohydrin, polynuclear dihydric phenol such as bisphenol A, 3,4-epoxycyclohexylmethyl-3,4-epoxycyclohexane carboxylate (available from Union Carbide as product ERL 4221), bis-(3,4-epoxycyclohexylmethyl)adipate (available from Union Carbide as product ERL 4299), diglycidyl ethers of bisphenol A and bisphenol F resins (e.g., 2,2'-methylenebisphenol), and diglycidyl esters of cyclic dicarboxylic acids and acid epoxidized cyclo-olefins. Additional suitable epoxies may be found in commonly assigned U.S. Pat. No. 5,102,772, filed Jul. 10, 1991, and U.S. Pat. No. 6,008,266, filed Aug. 14, 1996, both of which are incorporated by reference herein in their entireties. Further information and suitable epoxies may be found in Epoxy Resins Chemistry and Technology, $2^{nd}$ Ed., May, C. ed., Marcel Dekker, NY 1988.

Suitable curing agents generally include a multifunctional amine structure comprising at least one thermally-labile group. Preferably the multifunctional amine curing agent is a difunctional amine. More preferably, the difunctional amine has two terminal amine groups. Optionally, monofunctional amine comprising at least one thermally-labile group may be added to the multifunctional amine, such that the curing agent contains a mixture of multifunctional and monofunctional amine. The amine curing agent may also be polyfunctional, wherein the hydrogen atoms of the amine group are substituted, such that the individual amine groups may be primary ($NH_2R$), secondary (NHRR'), and tertiary (NRR'R") amines, preferably primary and secondary amines where R, R', and R" may be any alkyl, substituted alkyl, alkoxy, aryl, aryl alkyl, phenyl, benzyl, substituted phenyl, substituted benzyl, or combination thereof.

Curing agents of the present invention have at least one thermally-labile group. The thermally-labile groups of the curing agent include a nitrogen singly bonded to another nitrogen (N—N), a nitrogen doubly bonded to another nitrogen (N=N), a carbamate group ($NH_2COOR$ where R is generally any aliphatic or aromatic group) or derivatives thereof, or combinations thereof. If rework is necessary, decomposition of the cured thermally reworkable epoxy-based adhesive composition of the present invention generally occurs upon heating the crosslinked adhesive above the trigger temperature of the particular adhesive composition. The adhesive decomposes by chain scission of the N—N, N=N, and/or carbamate group introduced into the adhesive structure by the curing agent, thereby effecting depolymerization in the network. The trigger temperature of the epoxy composition may be tailored by appropriate selection of the particular thermally-labile group(s) incorporated in the curing agent. Examples of preferable difunctional amine-terminated curing agents include azodicarbonamide which is a primary or secondary difunctional amine having an N=N bond (e.g., azo moiety) as the thermally cleavable group, 4,4'-oxydibenzenesulfonyl hydrazide which is a primary or secondary difunctional amine having two N—N bonds as the thermally cleavable groups, and diamine carbamate which is a primary or secondary difunctional amine having a carbamate linkage ($NCO_2$) as the thermally cleavable group. Examples of monofunctional amine-terminated curing agents include p-toluenesulfonyl semicarbazide and p-toluene sulfonyl hydrazide which have a N—N bond as the thermally cleavable group.

A catalyst is provided to facilitate reaction (i.e., crosslinking) between the epoxy and the amine-containing curing agent. Suitable catalysts include acid anhydride, amines, $BF_3$-amine complexes, $BF_3$-phenol complexes, Mannich bases (e.g., $R^1CO$—$CHR^2CH_2$—$NR^3R^4$ where $R^1$, $R^2$, $R^3$, and $R^4$ are each different or the same group and each generally comprise any aliphatic or aromatic group substituted or unsubstituted), as well as other catalysts known to one skilled in the art. Examples of catalysts include hexahydrophthalic anhydride, tetrahydrophthalic anhydride, methyl-tetrahydrophthalic anhydride, methyl-hexahydrophthalic anhydride, dodecylsuccinic anhydride, nadic methyl anhydride, trimellitic anhydride, and maleic anhydride. Additional suitable catalysts may be found in commonly assigned U.S. Pat. No. 5,102,772, filed Jul. 10, 1991, and U.S. Pat. No. 6,008,266, filed Aug. 14, 1996, each of which are incorporated by reference herein in their entireties. Further information and suitable catalysts may be found in Epoxy Resins Chemistry and Technology, $2^{nd}$ Ed., May, C. ed., Marcel Dekker, NY 1988, particularly Chapter 3 (Section IV.A.2. listing of catalysts for accelerating the reaction of polyamides with epoxies).

In formulating the thermally reworkable epoxy-based composition, other components may be optionally added to manipulate the physical and/or chemical properties of the composition. For example, filler is typically added to provide stiffness to the epoxy and reduce the coefficient of thermal expansion. Depending upon the particular application, other fillers such as thixotropic fillers, electrically conductive fillers, and/or thermally conductive fillers may be added to the composition. Examples of fillers include fumed silica, fused silica, zinc oxide, alumina, corn starch, Kevlar® powder, metal flakes (e.g., silver, stainless steel, nickel-coated copper powder), boron nitride, silicon carbide, as well as many other fillers known to one skilled in the art.

One example of the synthesis of a thermally reworkable epoxy-based composition in accordance with the present invention is illustrated in the following general equation (i):

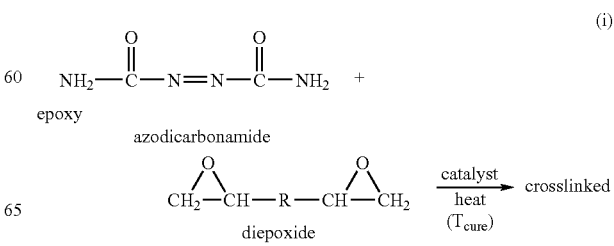

-continued

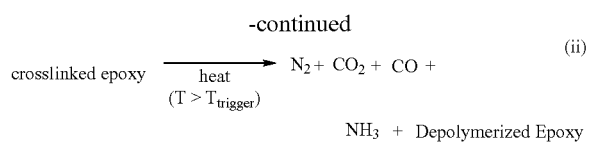

where R may be any alkyl, substituted alkyl, alkoxy, aryl, aryl alkyl, phenyl, benzyl, substituted phenyl, substituted benzyl, or combination thereof. In general equation (i), a thermally reworkable epoxy-based composition of the present invention is formulated by combining a difunctional amine curing agent having a N=N thermally-labile group and a diepoxide, and then heating the formulation to a cure temperature in a range of about 150° C.±20° C. in the presence of a catalyst. Heating the epoxy and curing agent to a cure temperature causes the epoxy and curing agent to crosslink thereby forming a thermally reworkable epoxy-based adhesive having thermally-labile groups as introduced into the adhesive structure by the curing agent. Using azodicarbonamide (e.g., Celogen® AZ a foaming agent available from Crompton Corporation located in Pawcatuck, Conn.) as the curing agent imparts a trigger temperature of the cured adhesive in a range of about 200° C. to about 225° C. In an example, a thermally reworkable epoxy-based composition is synthesized by combining about 80 to about 120 parts by weight cycloaliphatic epoxy, about 10 to about 30 parts by weight azodicarbonamide, about 20 to about 50 parts by weight hexahydrophthalic anhydride, and about 1 to about 6 parts by weight fumed silica.

Figure 1B:
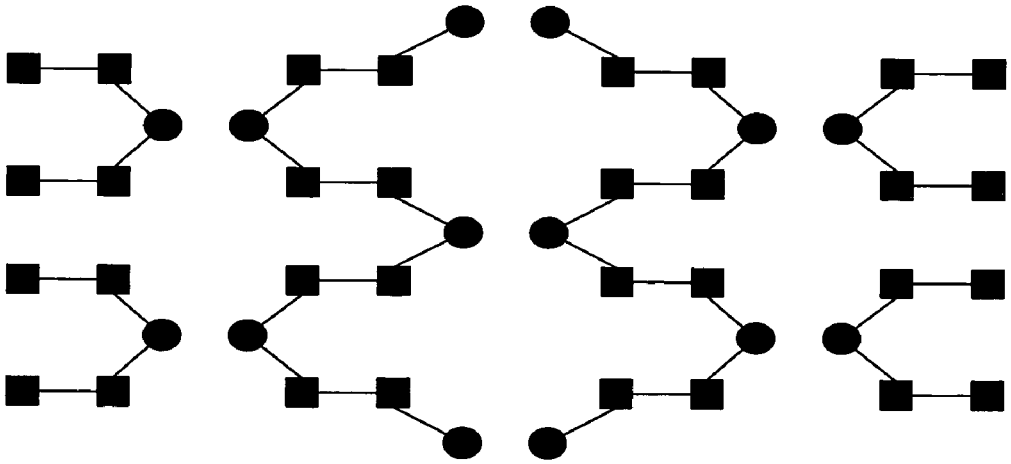

In general equation (ii), the thermally reworkable epoxy-based composition of the present invention is depolymerized by heating the cured thermally reworkable epoxy-based polymer to a temperature greater than or equal to the trigger temperature of the curing agent. As illustrated in FIGS. 1a and 1b, heating the polymer to a temperature greater than or equal to the trigger temperature, causes chain scission (i.e., depolymerization of the crosslinked epoxy) of the thermally-labile azo moiety groups of the curing agent as illustrated in FIG. 1a and, consequently, depolymerization of the crosslinked epoxy as depicted in FIG. 1b. As a result, the shear strength of the depolymerized network decreases such that localized removal of an electronic component may be achieved with relative ease.

EXAMPLE

In one example, samples of an encapsulant adhesive were prepared and shear strength measurements were made after exposing the samples to temperatures above and below the trigger temperature of the adhesive. Six samples were prepared by combining about 100 parts by weight 3,4-epoxy-cyclohexylmethyl-3,4-epoxycyclohexane carboxylate (ERL 4221), about 21 parts by weight azodicarbonamide having a decomposition temperature in a range of about 165° C. to about 180° C., about 34.5 parts by weight hexahydrophthalic anhydride (catalyst), and about 3 parts by weight fumed silica. Samples 1-6 were heated at a temperature of about 150° C. for four hours to cure the adhesive. Subsequently, samples 4-6 were heated for two hours at a temperature of about 225° C. to heat the samples to a temperature above the trigger temperature. Shear strength measurements were made using an Instron® Universal Materials Testing Machine (industry standard overlap shear strength method). Table 1 shows the relative shear strengths of the samples.

The mean shear strength of the samples baked at 150° C. is 1406 psi±157, whereas the mean shear strength of the samples baked at 225° C. is 258 psi±23. Thus, the encapsulant adhesive exhibits high shear strength after curing at about 150° C. and at the same time the introduction of the azo moiety imparts reworkability to the encapsulant by dramatically decreasing the shear strength at a rework temperature of about 225° C. The dramatic decrease in shear strength at rework temperatures of less than about 250° C. allows for removal of an individual component without damage to the PC board or other surrounding components.

TABLE 1

| Sample | Overlap Shear Strength (psi) | |
|---|---|---|
|  | baked at 150° C. | baked at 225° C. |
| 1 | 1372 | 285 |
| 2 | 1578 | 241 |
| 3 | 1269 | 250 |
| Mean | 1406 +/− 157 | 258 +/− 23 |

In another embodiment, an epoxy-based adhesive composition is formulated using both a curing agent having at least one thermally-labile group and a multifunctional epoxide having at least one thermally-labile group. Here, both the curing agent and the epoxide introduce thermally cleavable groups into the cured adhesive composition. The curing agent having at least one thermally-labile group may have a composition as described above. Also, as described above, a catalyst is typically used to facilitate reaction (i.e., crosslinking) between the multifunctional epoxide and the curing agent and an optional filler is provided to manipulate the physical and/or chemical properties of the composition.

Suitable epoxides having a thermally-labile group generally include multifunctional aliphatic or cycloaliphatic epoxy, such as diepoxides, triepoxides, tetraepoxides, or a combination mixture thereof depending upon the desired degree of crosslinking, as described above. Optionally, monofunctional epoxy may be added to the multifunctional epoxy, such that the uncured epoxy contains a mixture of multifunctional and monofunctional epoxides. In general, the multifunctional epoxide structure includes any thermally-labile group that undergoes chain scission at a temperature below about 250° C., wherein the cleavable group is located between two epoxy groups of the multifunctional epoxide. Examples of suitable thermally-labile groups (linkages) include alpha-alkoxy ester, oxycarbonyl, carbonate, carbamate, derivatives and combinations thereof. Other known thermally-labile linkages may also be used to impart a weak link in the epoxide structure which undergoes chain scission at a rework temperature equal to or greater than the trigger temperature of the particular thermally reworkable epoxy composition. Upon heating the crosslinked epoxy above the trigger temperature, the cured adhesive network structure decomposes by chain scission of the N—N, N═N, and/or carbamide group introduced by the curing agent and by chain scission of the alpha-alkoxy ester, carbonate, or carbamate linkage introduced by the epoxide. Consequently, the physical properties (e.g., shear strength) of the resulting depolymerized network are severely degraded thereby enabling easy removal of the device. An advantage of this embodiment is more extensive decomposition of the cured adhesive may be achieved due to the introduction of thermally-labile groups in both the curing agent and epoxide reactants.

An example of a suitable epoxide having an alpha-alkoxy ester linkage includes bis-1-(1',6'-hexoxy)ethyl-3,4-epoxycyclohexane carboxylate. Examples of epoxides having a carbonate group include di-3,4-epoxycyclohexylmethyl carbonate, di-1-(3,4-epoxycyclohexenyl)ethyl carbonate, and 4-epoxyethyllphenyl 2-(3-methyl-3,4-epoxycyclohexyl)-2-propyl carbonate. Examples of epoxides having carbamate or derivatives thereof (e.g., carbamate linkage) include 3,4-epoxycyclohexyl-1-isocyanate 3,4-epoxycyclohexylmethyl carbamate, 3,4-epoxycyclohexyl-1-isocyanate 2-(3,4-epoxycyclohexyl)-2-propyl carbamate, and 3,4-epoxycyclohexylmethyl 2-(1,2-epoxycyclohexyl)ethyl carbamate. An example of a suitable monofunctional epoxide having a carbonate includes 3,4-epoxycyclohexylmethyl t-butyl carbonate.

The trigger temperature of the epoxy composition may be tailored by appropriate selection of the particular thermally-labile groups incorporated into the curing agent and the epoxide. The decomposition temperature of the thermally-labile group introduced into the adhesive structure by the curing agent may be different from the decomposition temperature of the thermally-labile group introduced by the epoxide. As such, the trigger temperature of the adhesive is a temperature about equal to the higher of the two decomposition temperatures. Thus, exposing the cured adhesive to a rework temperature equal to or higher than the trigger temperature of the adhesive causes chain scission of both the curing agent thermally-labile group and the epoxide thermally-labile group. Alternatively, the decomposition temperature of the thermally-labile group introduced by the curing agent (e.g., carbamate) may be similar or the same as the thermally-labile group introduced by the epoxide (e.g., carbamate). In this case, exposing the cured adhesive to a rework temperature equal to or higher than the decomposition temperature (i.e., trigger temperature of the adhesive) causes chain scission of both the curing agent thermally-labile group and the epoxide thermally-labile group.

Figure 2A:
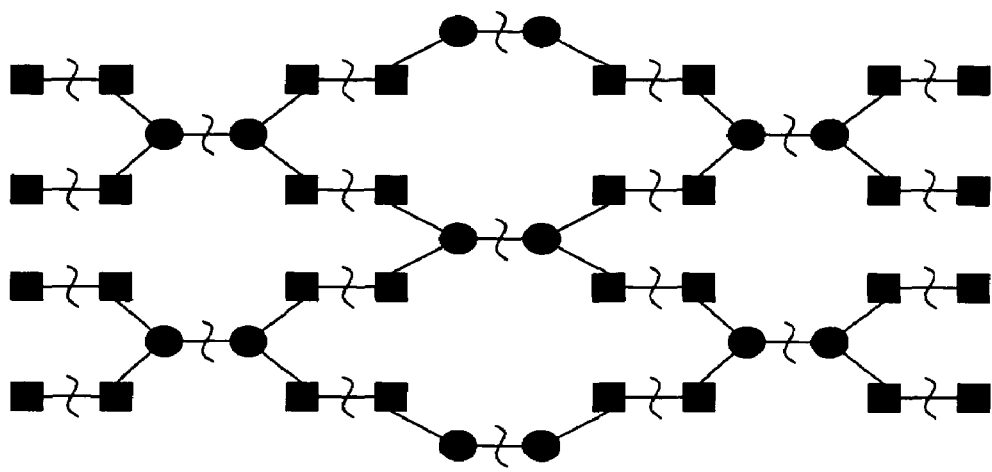
FIGS. 2a and 2b depict thermal decomposition of an exemplary thermally reworkable epoxy-based polymer formulated using both a curing agent composition having a thermally-labile group and an epoxide composition having a thermally-labile group.
Figure 2B:
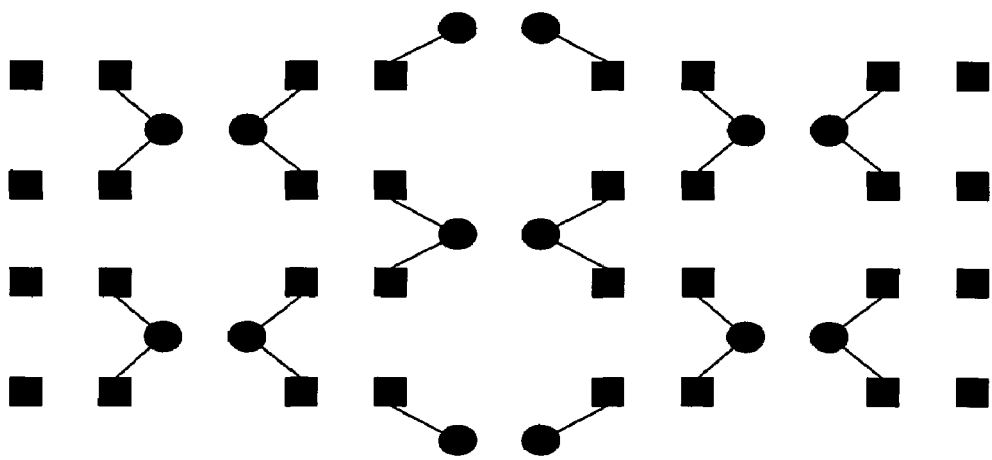

FIG. 2 is a schematic of thermal decomposition of an exemplary cured epoxy-based polymer formulated using an epoxide having thermally-labile groups and a curing agent having thermally-labile groups. As illustrated in FIGS. 2a and 2b, heating the crosslinked polymer to a temperature greater than or equal to the trigger temperature, causes chain scission (i.e., depolymerization of the crosslinked epoxy) of the thermally-labile groups introduced into the adhesive structure by both the curing agent and the epoxide. More extensive depolymerization of the epoxy may be achieved as depicted in FIG. 2b, as compared to the depolymerization of the epoxy having thermally-labile groups only in the curing agent as illustrated in FIG. 1b. As a result, the shear strength of the depolymerized network dramatically decreases such that localized removal of an electronic component may be achieved with relative ease.

While the foregoing is directed to embodiments of the present invention, other and further embodiments of the invention may be devised without departing from the basic scope thereof, and the scope thereof is determined by the claims that follow.

What is claimed is:

1. A thermally reworkable epoxy-based thermoset adhesive composition comprising a cured product of:
   a multifunctional epoxide;
   a curing catalyst; and
   a curing agent, the curing agent having at least one thermally-labile group, and is at least one of azodicarbonamide, p-toluenesulfonyl semicarbazide, 4,4'-oxydibenzenesulfonyl hydrazide, p-toluene sulfonyl hydrazide, and diamine carbamate;
   wherein the composition is thermally degradable by chain scission of the at least one thermally-labile group at a rework temperature less than about 250° C.

2. The thermally reworkable epoxy-based thermoset adhesive composition of claim 1, wherein the multifunctional epoxide comprises diepoxide, triepoxide, tetraepoxide, or mixture thereof.

3. The thermally reworkable epoxy-based thermoset adhesive composition of claim 2, wherein the epoxide further comprises monoepoxide.

4. The thermally reworkable epoxy-based thermoset adhesive composition of claim 1, further comprising a filler.

5. The thermally reworkable epoxy-based thermoset adhesive composition of claim 1, wherein the rework temperature is a temperature in a range of about 130° C. to about 250° C.

6. The thermally reworkable epoxy-based thermoset adhesive composition of claim 1, wherein the rework temperature is a temperature in a range of about 200° C. to about 250° C.

7. The thermally reworkable epoxy-based thermoset adhesive composition of claim 1, wherein the epoxide comprises a second thermally-labile group, wherein the composition is thermally degradable by chain scission of the second thermally-labile group at a second temperature greater than or equal to a second trigger temperature of the composition.

8. The thermally reworkable epoxy-based thermoset adhesive composition of claim 7, wherein the second thermally-labile group consists of a linkage selected from a group consisting of alpha-alkoxy ester, oxycarbonyl, carbonate, carbamate, derivatives and combinations thereof.

9. The thermally reworkable epoxy-based thermoset adhesive composition of claim 7, wherein the at least one thermally-labile group of the curing agent and the second thermally-labile group of the epoxide undergo chain scission at a temperature less than about 250° C.

10. A thermally reworkable epoxy-based thermoset adhesive composition comprising a cured product of:
    an epoxide;
    a curing catalyst; and
    a thermally degradable curing agent, the curing agent having at least one thermally-labile group, and is at least one of azodicarbonamide, p-toluenesulfonyl semicarbazide, 4,4'-oxydibenzenesulfonyl hydrazide, p-toluene sulfonyl hydrazide, and diamine carbamate;
    wherein the composition is thermally degradable by chain scission of the at least one thermally-labile group at a rework temperature having a value about 20° C. to about 125° C. higher than a curing temperature of the composition.

11. A thermally reworkable epoxy-based thermoset adhesive composition comprising a cured product of:
    a curing agent, the curing agent having at least one first thermally-labile group and is at least one of azodicarbonamide, p-toluenesulfonyl semicarbazide, 4,4'-oxydibenzenesulfonyl hydrazide, p-toluene sulfonyl hydrazide, and diamine carbamate;
    a curing catalyst; and
    a multifunctional epoxide, the multifunctional epoxide having at least one second thermally-labile group;
    wherein the composition is thermally degradable by chain scission of the at least one first thermally-labile group and the at least one second thermally-labile group at a rework temperature having a value about 20° C. to about 125° C. higher than a curing temperature of the composition.

12. A method of reworking a thermally reworkable epoxy-based thermoset adhesive composition comprising a cured product of:

a multifunctional epoxide;

a curing catalyst; and a curing agent, the curing agent having at least one thermally-labile group, and is at least one of azodicarbonamide, p-toluenesulfonyl semicarbazide, 4,4'-oxydibenzenesulfonyl hydrazide, p-toluene sulfonyl hydrazide, and diamine carbamate;

wherein the method comprises heating the composition to a rework temperature less than about 250° C. to thermally degrade the composition by chain scission of the at least one thermally-labile group.

13. A method of reworking a thermally reworkable epoxy-based thermoset adhesive composition comprising a cured product of:

a curing agent, the curing agent having at least one first thermally-labile group, and is at least one of azodicarbonamide, p-toluenesulfonyl semicarbazide, 4,4'-oxydibenzenesulfonyl hydrazide, p-toluene sulfonyl hydrazide, and diamine carbamate;

a curing catalyst; and a multifunctional epoxide, the multifunctional epoxide having at least one second thermally-labile group;

wherein the method comprises heating the composition to a rework temperature less than about 250° C. to thermally degrade the composition by chain scission of the at least one first thermally-labile group and the at least one second thermally-labile group.

* * * * *